United States Patent
Makwana et al.

[11] Patent Number: 5,886,928
[45] Date of Patent: Mar. 23, 1999

[54] NON-VOLATILE MEMORY CELL AND METHOD OF PROGRAMMING

[75] Inventors: Jitendra J. Makwana, Chandler; Darryl F. Monteilh, Mesa; Effiong A. Omon, Highley, all of Ariz.

[73] Assignee: Motorola, Inc., Schaumburg, Ill.

[21] Appl. No.: 963,212

[22] Filed: Nov. 3, 1997

Related U.S. Application Data

[62] Division of Ser. No. 604,321, Feb. 21, 1996, Pat. No. 5,703,808.

[51] Int. Cl.$^6$ ....................................................... G11C 11/34
[52] U.S. Cl. ................................ 365/185.27; 365/185.28; 365/185.29
[58] Field of Search ......................... 365/185.27, 185.28, 365/185.29

[56] References Cited

U.S. PATENT DOCUMENTS

| | | | |
|---|---|---|---|
| 3,893,151 | 7/1975 | Bosselaar et al. | 365/185.27 |
| 4,758,984 | 7/1988 | Yoshida | 365/53 |
| 4,884,239 | 11/1989 | Ono et al. | 365/218 |
| 5,225,362 | 7/1993 | Bergemont | 365/185.28 |
| 5,293,331 | 3/1994 | Hart et al. | 365/185.27 |
| 5,341,342 | 8/1994 | Brahmbhatt | 365/185.27 |
| 5,453,393 | 9/1995 | Bergemont | 365/185.28 |
| 5,572,464 | 11/1996 | Iwasa | 365/185.27 |
| 5,594,685 | 1/1997 | Bergemont et al. | 365/185.28 |

FOREIGN PATENT DOCUMENTS

| | | |
|---|---|---|
| 6146073 | 6/1986 | European Pat. Off. . |
| 0393737 | 10/1990 | European Pat. Off. . |

OTHER PUBLICATIONS

S. Zhao et al., "P–Well Bias Dependence of Electron Trapping in Gate Oxide of n–MOSFETs During Substrate Hot–Electron Injection." Electronics Letters, Oct. 22,1992, vol. 28, No. 22, pp. 2080–2082.

*Primary Examiner*—Son T. Dinh
*Attorney, Agent, or Firm*—Kenneth M. Seddon; Daniel R. Collopy

[57] ABSTRACT

The programming time of a non-volatile memory cell (13) is reduced by forming the non-volatile memory cell (13) in a well region (12). The presence of the well region (12) increases the number of electrons that are present in a channel region (14) of the non-volatile memory cell (13). The number of electrons in the channel region (14) is also increased by placing a voltage potential on the well region (12) relative to a source region (15). The voltage differential will inject electrons into the well region (12), which increases the number of electrons in the channel region (14).

10 Claims, 1 Drawing Sheet

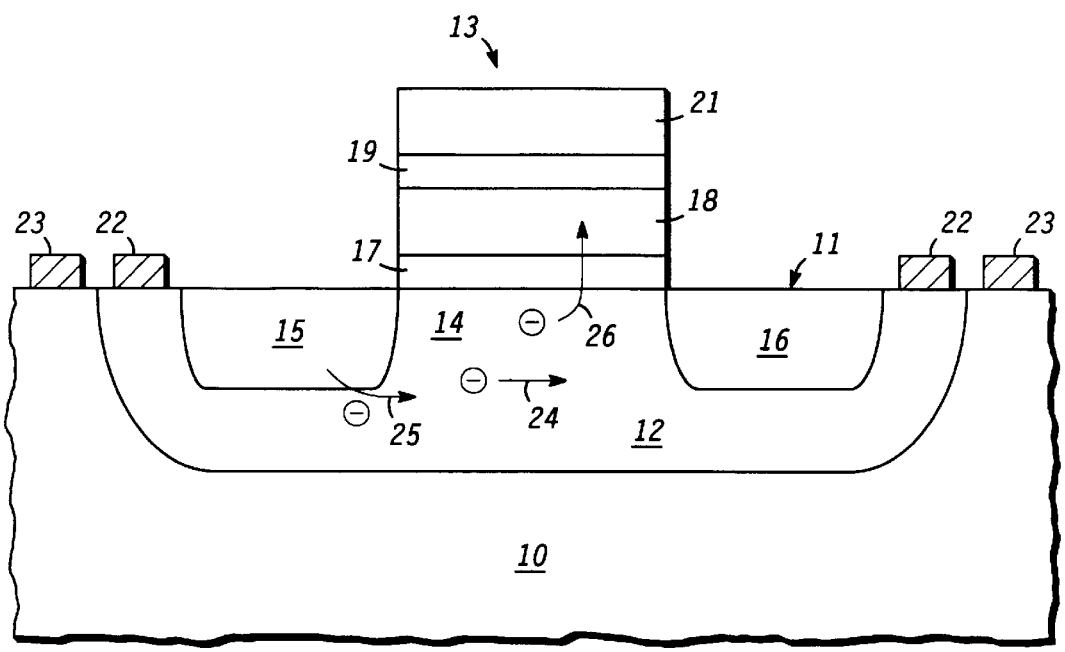

NON-VOLATILE MEMORY CELL AND METHOD OF PROGRAMMING

This is a division of application Ser. No. 08/604, 321, filed Feb. 21, 1996 now U.S. Pat. No. 5,703,808.

BACKGROUND OF THE INVENTION

This invention relates, in general, to non-volatile semiconductor memory devices, and more particularly, to methods of programming a non-volatile memory cell.

Electrically programmable read only memories (EPROMs) are non-volatile memory devices that are programmed using electrical signals. Within an EPROM device are a plurality of memory cells, each of which may be individually programmed. In general, an EPROM cell includes a floating gate transistor which stores the digital value of each particular memory cell.

To program an EPROM memory cell, a phenomenon known as hot carrier injection (HCI) is commonly used. Using HCI, a negative charge is stored in the floating gate of each memory cell. For example, programming is accomplished by passing a current from a drain terminal to a source terminal of the floating gate transistor. The flow of current will pass electrons under the dielectric layer of the floating gate transistor. A positive voltage is then placed on the control gate of the memory cell so that electrons are directed towards and embedded into the floating gate where they become trapped. Once a sufficient amount of electrons are stored on the floating gate, the electrical state of the floating gate will be changed and the memory cell is considered to be programmed.

The design and operation of traditional EPROM devices are limited by the amount of current that can pass under the dielectric layer. This limits the rate at which electrons can be trapped in the floating gate. As a result, it is quite common for it to take up to 20 milliseconds to program each memory cell. When this time is multiplied by the number of memory cells in each EPROM device and then multiplied by the number of EPROM devices in each manufacturing lot, it is quite common for the programming sequence of all the memory cells in a manufacturing lot to exceed 10 hours. Since most manufacturing flows include a functional verification of each memory cell, the 10 hours necessary to program each memory cell significantly contributes to the total test time of EPROM devices, and thus contributes to the final manufacturing cost of EPROM devices.

By now it should be appreciated that it would be advantageous to provide a structure and a technique for reducing the programming time of a non-volatile memory cell. It would also be advantageous if the technique did not appreciably increase the processing complexity or manufacturing cost of the non-volatile memory array.

BRIEF DESCRIPTION OF THE DRAWING

The sole figure is a cross-sectional view of a memory cell according to the present invention.

DETAILED DESCRIPTION OF THE DRAWING

The present invention provides a technique for reducing the programming time of non-volatile memory cells. The programming time is reduced by increasing the number of electrons that flow from the source region to the drain region of the non-volatile memory cell. By increasing the number of electrons that flow through the channel, the rate at which electrons are trapped in a floating gate can be increased. An increase in the rate at which electrons are trapped in the floating gate reduces the time it takes to change the electrical state of the non-volatile memory cell, and thus reduces the time it takes to program the non-volatile memory cell.

In the following examples and in the referenced figure, an electrically programmable read only memory (EPROM) is used to demonstrate the programming technique of the present invention. An EPROM cell is a non-volatile memory cell that has a channel region between a source region and a drain region. The EPROM cell also has a floating gate region and a dielectric layer overlying the channel region. One way to program an EPROM cell is to first direct a current flow from the drain region to the source region. Then a voltage potential is placed on a control gate region to attract and trap electrons in the floating gate. Such a technique is referred to as hot carrier injection.

The programming time of such a technique is limited by the number of electrons that are present in the channel region. The present invention increases the number of electrons in the channel region by forming a well region and then placing the well region at a higher voltage potential than the source region. The voltage differential will inject electrons into the well region. This in turn, increases the number of electrons in the channel region. The additional electrons in the channel region will reduce the amount of time it takes to program the non-volatile memory cell.

Referring now to the figure, a more detailed description of the present invention will be provided. The figure is a cross-sectional view of a non-volatile memory cell 13 shown as an EPROM. It should also be understood that the present invention can be used to improve the programming time of any non-volatile memory cell that uses hot carrier injection for programming. Therefore, the present invention can also be used to improve the programming time of an electrically erasable and programmable read only memory (EEPROM), a flash electrically programmable read only memory (flash EPROM), or a flash electrically erasable and programmable read only memory (flash EEPROM).

As shown in the figure, non-volatile memory cell 13 comprises a source region 15 and a drain region 16 that are formed in a body of semiconductor material or a semiconductor substrate 10. A channel region 14 is defined as the area between source region 15 and drain region 16. Overlying channel region 14 is a first dielectric layer 17 that is formed on a surface 11 of semiconductor substrate 10. Overlying first dielectric layer 17 is a floating gate region 18, which is used to trap electrons from channel region 14 as will be described shortly. In addition, non-volatile memory cell 13 also comprises a second dielectric layer 19 and a control gate region 21 that overlie floating gate region 18.

The present invention differs from traditional EPROM devices in that non-volatile memory cell 13 is formed in a well region 12. Traditional EPROM cells are not formed in a well region, but rather are formed in an intrinsic substrate that has either no doping concentration or a very low doping concentration. Because of the low doping concentration, traditional EPROM cells have a low concentration of electrons in the channel region. The limited number of electrons in the channel region is what contributes to the long programming time of traditional non-volatile memory cells. Well region 12 of the present invention is a highly doped region that is of the opposite conductivity of source region 15. For example, if source region 15 is n-type, then well region 12 is a highly doped p-type region.

Well region 12 of the present invention reduces the programming time of non-volatile memory cell 13 for two reasons. Firstly, the high dopant concentration of well region 12 will provide more electrons in channel region 14, which increases the rate at which electrons are trapped in floating gate region 18. Secondly, because well region 12 is of opposite conductivity compared to source region 15, a PN diode junction is formed at the interface of source region 15 and well region 12. To take advantage of this diode junction, a positive voltage potential relative to source region 15, is placed on well region 12. This creates a forward bias condition across the diode junction so that electrons are injected into well region 12. The electrons injected into well region 12 will increase the number of electrons traveling across channel region 14 so that the programming time of non-volatile memory cell 13 is improved.

A more detailed description of how well region 12 reduces the programming time of non-volatile memory cell 13 will now be provided with an example of the electrical conditions in non-volatile memory cell 13 during programming. To program non-volatile memory cell 13, a first voltage potential of about 1 volt to 25 volts is placed on drain region 16. A second voltage potential of about 0 volts to 5 volts, preferably 0 volts or ground, is placed on source region 15. These voltage conditions will produce a current flow in channel region 14 from drain region 16 to source region 15. This will produce a flow of electrons as shown in the figure by arrow 24 to be from source region 15 to drain region 16.

First electrical contacts 22 are used to apply a third voltage potential to well region 12. This third voltage potential is less than the first voltage potential on drain region 16 and is greater than the second voltage potential placed on source region 15. preferably, the third voltage potential is less than the first voltage potential by at least 1 volt and is greater than the second voltage potential by at least 1 volt. For example, the first voltage potential can be about 8 to 20 volts, the second voltage is at a ground potential, and the third voltage potential is about 3 to 7 volts.

Because the third voltage potential is positive or greater than the second voltage potential, electrons will be injected into well region 12. The flow of electrons due to this voltage differential is shown in the figure as arrow 25. The additional electrons are then drawn out of well region 12 by the first voltage potential on drain region 16, which in turn increases the number of electrons in channel region 14. A fourth voltage potential is then placed on control gate region 21 so that a portion of the electrons in channel region 14 will be directed towards and embedded into floating gate region 18. The flow of electrons into floating gate region 18 is shown in the figure as arrow 26. Once sufficient charge is stored on floating gate region 18, a net negative voltage will be placed on floating gate region 18, which retards the electron injection into floating gate region 18. The negative voltage potential on floating gate region 18 is what indicates that non-volatile memory cell 13 is in the programmed state.

Again, traditional non-volatile memory cells are not formed in a well region, but rather in a semiconductor substrate. During programming, both the substrate and the source region are grounded to reduce leakage current flow and to prevent the reverse biasing of any sensitive diode junctions. The present invention differs in that well region 12 is formed in semiconductor substrate 10 and well region 12 is placed at a different voltage potential than semiconductor substrate 10 during programming. To provide the necessary voltage potentials, well region 12 uses first electrical contacts 22, and semiconductor substrate 10 has second electrical contacts 23. First electrical contacts 22 and second electrical contacts 23 are electrically isolated from each other so that a fifth voltage potential, preferably 0 volts, can be placed on semiconductor substrate 10 while the third voltage potential is placed on well region 12 during programming.

For comparison, the programming time of a traditional non-volatile memory cell and the programming time of a non-volatile memory cell having well region 12 according to the present invention are provided below. The traditional non-volatile memory cell was programmed by placing 15 volts on the control gate region and 10 volts on the drain region, and by grounding the substrate and source region. Such a technique requires a programming time of 70 $\mu$sec due to the reduced number of electrons flowing from the source region to the drain region. A non-volatile memory cell according to the present invention was then programmed by placing 15 volts on control gate region 21 and 10 volts on drain region 16, source region 15 and substrate 10 were grounded, and by placing 3 volts on well region 12. The programming time of non-volatile memory cell 13 was 0.5 $\mu$sec. Therefore, the programming time of the present invention is about 140 times faster than the programming method of traditional non-volatile memory cells.

The improvement in programming time not only reduces the test time and thus the manufacturing cost of non-volatile memory cell 13, but also improves the reliability of non-volatile memory cell 13 as well. Most EPROM devices are an array of EPROM cells that are configured so that a row of multiple cells share the same electrical connections. For instance, the control gate regions of all the EPROM cells in a row may be tied together. This can create a problem during programming sequences known as the gate disturb problem. If only one of the EPROM cells in a row of cells is being programmed, all of the cells in that row still have the programming voltage at the control gate region of each cell. The high voltage potential on the control gate region of the EPROM cells that are not being programmed will undesirably pull electrons off the floating gate region. With time, sufficient charge may be pulled off the floating gate region so that the state of those memory cells is disturbed. This is why this phenomenon is called the gate disturb problem.

The present invention significantly reduces the effects of the gate disturb problem by significantly reducing the programming time of each memory cell. The programming technique of the present invention can reduce the programming time of each memory cell by over 100 fold. The reduction in programming time will reduce the amount of time that the high voltage potential is present on the control gate region of each non-volatile memory cell in the array. Therefore, the improvement in programming time of the present invention offers a directly proportional improvement in the gate disturb problem as well.

A method for forming non-volatile memory cell 13 of the figure will now be provided. In the following example, non-volatile memory cell 13 is formed as an n-channel device. It should also be understood that a p-channel device can be formed by changing n-type regions to p-type and vice versa. First semiconductor substrate 10 is provided, which is preferably a silicon substrate that may be lightly doped to either n- or p- type conductivity. It should also be understood that the body of semiconductor material that non-volatile memory cell 13 is formed in can be provided using an epitaxial layer or a portion of a bonded semiconductor substrate. Well region 12 is then formed as a p-type region by doping semiconductor substrate 10. For example well region 12 can be formed by implanting semiconductor substrate 10 with boron with a dose of about $1\times10^{12}$ atoms per cm$^2$ to $1\times10^{17}$ atoms per cm$^2$ and an energy of about 35 kev to 150 kev.

First dielectric layer 17 is then formed on surface 11 of semiconductor substrate 10. Preferably, first dielectric layer 17 is 500 angstroms thick and is made from a layer of silicon dioxide. It should also be understood that first dielectric layer 17 can be about 300 angstroms to 1000 angstroms thick and comprise a sequence of dielectric materials such as silicon, silicon nitride, silicon oxide, or silicon dioxide. Floating gate region 18 is then formed and patterned on first dielectric layer 17. Floating gate region 18 preferably is made from polysilicon and is about 200 angstroms to 4000 angstroms thick. Floating gate region 18 and first dielectric layer 17 are then formed to expose portions of surface 11 of semiconductor substrate 10.

A masking layer (not shown) is then used in conjunction with the remaining portion of floating gate region 18 to define the portions of semiconductor substrate 10 where source region 15 and drain region 16 are formed. Source region 15 and drain region 16 are then formed as n-type regions with an implant of phosphorus or arsenic with a dose of about $1 \times 10^{14}$ atoms per cm$^2$ to $1 \times 10^{17}$ atoms per cm$^2$ and an energy of about 50 kev to 150 kev. Second dielectric layer 19 and control gate region 21 are then formed on floating gate region 18. Second dielectric layer 19 is formed from a dielectric material such as silicon, silicon nitride, silicon oxide, or silicon dioxide and control gate region 21 is preferably formed from polysilicon. Second dielectric layer 19 is about 300 angstroms to 1000 angstroms thick and control gate region 21 is about 200 angstroms to 4000 angstroms thick.

First electrical contacts 22 and second electrical contacts 23 are then formed to well region 12 and semiconductor substrate 10 respectively. First electrical contacts 22 and second electrical contacts 23 can be formed from a variety of conductive material such as doped polysilicon, aluminum, or the like. Again, first electrical contacts 22 and second electrical contacts 23 are electrically isolated from each other so that different voltage potentials can be placed on well region 12 and semiconductor substrate 10.

By now it should be appreciated that the present invention provides a method for improving the programming time of a non-volatile memory cell. The non-volatile memory cell is formed in a doped well region, which increases the number of electrons in the channel region of the non-volatile memory cell. A voltage potential is also placed on the well region so that additional electrons are present in the channel region of the non-volatile memory cell. The additional electrons increase the rate at which electrons are trapped in the floating gate region so that the programming time is reduced. A reduction in programming time not only reduces the test time and manufacturing cost of the non-volatile memory cell, but also reduces the effects of the gate disturb phenomenon during programming. The formation of the well region comes at a minimal processing cost or complexity, but reduces the test cost of the non-volatile memory cell by as much as two orders of magnitude.

We claim:

1. A method for programming a memory device comprising the steps of:
    providing the memory device having a charge storage region a first doped region, and a second doped region wherein the first doped region is electrically isolated from the second doped region;
    providing a first source of electrons that originate from the first doped region
    providing a second source of electrons that originate from the second doped region; and
    providing a first voltage potential to the memory device so that at least a portion of the electrons from the first source of electrons and at least a portion of the electrons from the second source of electrons are stored in the charge storage region.

2. The method of claim 1 wherein the step of providing the memory device includes the step providing the memory device having a first current carrying electrode provided by the first doped region and a second current carrying electrode, and the step of providing the first source of electrons includes the step of placing a second voltage potential on the second current carrying electrode so that a first current passes between the first current carrying electrode and the second current carrying electrode.

3. The method of claim 2 wherein the step of providing the second source of electrons includes the step of placing a third voltage potential on the second doped region.

4. The method of claim 3 further comprising the step of placing a fourth voltage potential on the first current carrying electrode so that a second current passes between the first current carrying electrode and the second doped region.

5. The method of claim 4 wherein the step of providing the memory device includes providing the memory device so that the first current carrying electrode and the second current carrying electrode are within the second doped region.

6. The method of claim 5 wherein the step of providing the memory device includes providing the memory device having a dielectric layer with a thickness of greater than 250 angstroms.

7. The method of claim 5 wherein the step of providing the memory device includes providing a memory device selected from the group consisting of an electrically programmable read only memory, an electrically erasable and programmable read only memory, a flash electrically erasable and programmable read only memory, and a flash electrically programmable read only memory.

8. A method for programming a non-volatile memory device comprising the steps of:
    providing the non-volatile memory device comprising:
        a substrate;
        a first current carrying electrode in the substrate;
        a second current carrying electrode in the substrate;
        a doped region in the substrate;
        a charge storage region; and
        a control gate structure coupled to the charge storage region;
    placing a first voltage potential on the first current carrying electrode so that a first current flows between the first current carrying electrode and the second current carrying electrode;
    providing an additional source of electrons that originate from the doped region; and
    placing a second voltage potential on the control gate structure so that at least a portion of the electrons from the first current and at least a portion of the electrons from the additional source of electrons are stored in the charge storage region.

9. The method of claim 8 wherein the step of providing the additional source of electrons includes the step of placing a third voltage potential on the doped region so a second current flows between the doped region and the second current carrying electrode.

10. The method for programming a memory device of claim 1 wherein the step of providing the memory device includes providing a memory device so that the first doped region is electrically isolated from the second doped region by a PN junction.

* * * * *